United States Patent
Ogawa

(10) Patent No.: US 7,235,309 B2
(45) Date of Patent: Jun. 26, 2007

(54) ELECTRONIC DEVICE HAVING EXTERNAL TERMINALS WITH LEAD-FREE METAL THIN FILM FORMED ON THE SURFACE THEREOF

(75) Inventor: Kenta Ogawa, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 140 days.

(21) Appl. No.: 10/735,900

(22) Filed: Dec. 16, 2003

(65) Prior Publication Data

US 2004/0126268 A1 Jul. 1, 2004

(30) Foreign Application Priority Data

Dec. 16, 2002 (JP) .............................. 2002-364235

(51) Int. Cl.
*H01R 13/03* (2006.01)
*H01L 23/495* (2006.01)

(52) U.S. Cl. .................. 428/647; 428/646; 428/648; 428/926; 428/929; 257/779

(58) Field of Classification Search .................. None
See application file for complete search history.

(56) References Cited

U.S. PATENT DOCUMENTS

| | | | |
|---|---|---|---|
| 4,014,660 A | * | 3/1977 | Schreiner et al. ............ 428/646 |
| 6,110,608 A | * | 8/2000 | Tanimoto et al. ............ 428/647 |
| 6,195,248 B1 | | 2/2001 | Kunishi et al. |
| 6,334,570 B1 | * | 1/2002 | Koshi et al. ............ 228/180.22 |
| 6,392,293 B2 | | 5/2002 | Sugihara et al. |
| 6,395,583 B1 | | 5/2002 | Kubara et al. |
| 2002/0009610 A1 | * | 1/2002 | Shimokawa et al. ........ 428/647 |
| 2002/0019077 A1 | | 2/2002 | Shimokawa et al. |

FOREIGN PATENT DOCUMENTS

| | | | |
|---|---|---|---|
| JP | 55-122842 | * | 9/1980 |
| JP | 11-251503 | | 9/1999 |
| JP | 11-330340 | | 11/1999 |
| JP | 2000-174191 | | 6/2000 |
| JP | 2001-053211 | | 2/2001 |
| JP | 2001-257303 | | 9/2001 |
| JP | 2002-141456 | | 5/2002 |
| JP | 2002-151838 | | 5/2002 |

* cited by examiner

*Primary Examiner*—John J. Zimmerman
(74) *Attorney, Agent, or Firm*—Young & Thompson

(57) ABSTRACT

A resin sealed IC has a plurality of external terminals. A metal thin film made of a Sn—Bi alloy is formed in direct contact with the surface of a base member of each external terminal. A Bi content in the Sn—Bi alloy layer is within a range of 0.5 to 6.0 wt %. Further, the Sn—Bi alloy layer has a single-layer plating structure, and the film thickness is within a range of 10 to 25 MIC.

14 Claims, 10 Drawing Sheets

ELECTRONIC DEVICE HAVING EXTERNAL TERMINALS WITH LEAD-FREE METAL THIN FILM FORMED ON THE SURFACE THEREOF

BACKGROUND OF THE INVENTION

1. Field of the Invention

The present invention relates to an electronic device in which a lead-free (hereinafter referred to as "Pb-free") metal thin film containing tin (hereinafter referred to as "Sn") as a main component is formed on the surfaces of external terminals.

2. Description of the Prior Art

Electronic apparatuses which are used in a wide variety of fields are assembled of various electronic devices such as a semiconductor integrated circuit (hereinafter referred to as "IC"), a transistor, a capacitor, a resistor and an inductor. To assemble such electronic apparatuses, a circuit board on which a circuit pattern formed by a electrical conducting layer is printed in advance is used, and a plurality of electronic devices are mounted on the circuit board. More specifically, the external terminals of the electronic device are electrically connected and physically attached to a portion of the circuit pattern with a low-melting solder. To secure reliability of connection between the electronic device and the circuit board, in a metal thin film, which is made generally of a Sn—Pb alloy is formed in advance on the surface of the external terminals of the electronic device by a surface treatment method such as electroplating. (Hereinafter, "reliability of connection between the electronic device and the circuit board" is referred to as "bonding reliability".)

However, Pb presents a danger to public health and causes environmental pollution when a used electronic apparatus is discarded. Thus, a use of the Sn—Pb alloy is not desirable from the viewpoint of environmental protection. Under such circumstances, a material comprising a Sn-based alloy containing no Pb, which is the so-called Pb-free Sn-based alloy, is required to be used as the low-melting solder. It is also required that a metal thin film comprising the Pb-free Sn-based alloy is formed on the surface of a lead base material of an electronic device by plating.

When the metal thin film comprising the Pb-free Sn-based alloy is formed on the surface of the base member by plating, it is important that the metal thin film, which does not impair the wettability of the low-melting solder and can secure bonding reliability, is formed regardless of which metal is chosen as an additive metal to be added to Sn. As an example, an electronic device in which a Sn-bismuth (hereinafter referred to as "Sn—Bi") alloy is plated on the surface of a base member as a metal thin film is widely known. As in the case of Pb in the above Sn—Pb alloy, Bi is a metal which forms a low-melting alloy together with Sn and lowers the melting point of the alloy. Applying the Sn—Bi alloy to the metal thin film of external terminals is disclosed in Japanese Patent Laid-Open Publication Nos. 2000-174191, 2001-257303, Hei 11-330340, 2001-53211, 2002-151838, 2002-141456 and Hei 11-251503, and U.S. Pat. No. 6,195,248, U.S. Pat. No. 6,392,293 and U.S. Pat. No. 6,395,583, and U.S. Patent Application Publication No. US 2002/0019077.

When a Sn—Bi alloy is used as the above Pb-free Sn-based alloy and a metal thin film comprising the Sn—Bi alloy is formed on the surface of a base member by plating, the growth of fine metal whiskers is liable to occur on the surface of the external terminal when an electronic device is subjected to an acceleration test such as a temperature cycling test after production of the electronic device, as compared with a case where the metal thin film is formed by use of an Sn—Pb alloy. Further, it is concerned that these whiskers may make short-circuit between the adjacent external terminals. Such short-circuit is more likely to take place in a semiconductor device such as an IC in which a plurality of external terminals are derived from the periphery of a package body at minute intervals. In addition, since the Sn—Bi alloy has poor ductility, bending cracks (hereinafter simply referred to as "cracks") are liable to occur in the Sn—Bi alloy layer when the external terminals are bent upon, e.g., implementation of the electronic device. Therefore, suppression of the occurrences of whiskers growth and cracks formation is significantly important when a metal thin film comprising a Pb-free Sn-based alloy is formed on the surface of a base member of an electronic device by plating.

This discussion for suppressing the occurrences of whiskers growth and cracks formation in a Pb-free metal thin film, formed on the surface of a base member are made in Japanese Patent Laid-Open Publication Nos. 2000-174191, 2001-257303 and Hei 11-330340.

Japanese Patent Laid-Open Publication No. 2000-174191 discloses a semiconductor device having a lead of which a cross sectional structure is shown in FIG. 12. The lead of the semiconductor device is formed by plating a lower layer 102 which comprises an Sn—Bi alloy having a Bi content of 0.7 wt % (weight %), an intermediate layer 103 which comprises an Sn—Bi alloy having a Bi content of 0.7 to 2.3 wt % and an upper layer 104 which comprises an Sn—Bi alloy having a Bi content of 2.3 wt % on a surface of a base member 101. The three Sn—Bi alloy layers having different Bi contents have such a concentration gradient that the contents of the alloy components increase in a plating film thickness direction.

Further, Japanese Patent Laid-Open Publication No. 2001-257303 discloses a lead material for electronic devices which has a cross sectional structure as shown in FIG. 13. On a surface of a base member 111 of the lead material for electronic devices, a plating layer 112 which comprises an Sn—Cu alloy having a Cu content of 0.4 to 5 wt % and a film thickness of 1 to 15 micrometers (hereinafter referred to as "MIC") is formed.

Further, Japanese Patent Laid-Open Publication No. Hei 11-330340 discloses a semiconductor device having a lead of which a cross sectional structure is shown in FIG. 14. The lead of the semiconductor device is formed by plating a lower layer 122 which comprises an Sn—Bi alloy having a Bi content of 0 to 1 wt % and a film thickness of 1 to 14 MIC and an upper layer 123 which comprises an Sn—Bi alloy having a Bi content of 1 to 10 wt % and a film thickness of 1 to 12 MIC on a surface of a base member 121.

It is, however, recognized by present inventor that the above prior arts have the following problems.

The conventional semiconductor devices use the Pb-free Sn-based alloys as the metal thin films to be formed on the surfaces of the base members, and the metal thin films are formed by multilayer plating so as to suppress the occurrences of whiskers growth and cracks formation, so that a plating step becomes complicated and costs of a plating process is driven up.

Further, along with the multilayer plating structures, strict control of the contents of the metals to be added to Sn becomes difficult.

In addition, since the contents of the metals to be added to Sn and the plating film thicknesses are not adjusted to right values in accordance with the kinds of the metals to be added to Sn, it is difficult to sufficiently suppress the occurrences of whiskers growth and cracks formation.

For example, it is known that when the above Sn—Bi alloy is plated as a metal thin film to be formed on the surface of a base member of an external terminal, reliability of connection between the external terminal and a circuit board after the electronic device is mounted on the circuit board by soldering is significantly influenced by the content of Bi in the metal thin film. Therefore, it is an important point for guaranteeing product quality to strictly control the Bi content in the metal thin film. For that purpose, the content of Bi in the metal thin film is estimated with high accuracy in a non-destructive manner by a method such as a fluorescent X-ray analysis.

SUMMARY OF THE INVENTION

According to an aspect of the present invention, there is provided an electronic device that includes a plurality of external terminals each having a base member and a metal thin film formed in direct contact with a surface of the base member, the metal thin film being made of an alloy of tin and bismuth and the bismuth being contained in the alloy so as to satisfy any one of the following conditional expressions;

$20 \leq Xm \leq 25$ and $0.5 \leq Cam \leq 4.5$, (a)

$15 \leq Xm \leq 20$ and $0.7 \leq Cam \leq 4.5$, (b)

$10 < Xm \leq 15$ and $4.5 \leq Cam \leq 6.0$, (c)

wherein Xm indicating the thickness (MIC) of the metal thin film and Cam indicating wt % of the bismuth in the metal thin film.

According to another aspect of the present invention, there is provided an electronic device that includes a plurality of external terminals each having a base member and a metal thin film formed in direct contact with a surface of the base member, the metal thin film being made of an alloy of tin and bismuth and the bismuth being contained in the alloy so as to satisfy any one of the following conditional expressions;

$10 < Xm \leq 25$, $0.5 \leq Cam \leq 6.0$ and $-8Cam+46 < Xm \leq -8Cam+54$, (a)

$10 < Xm \leq 25$, $0.5 \leq Cam \leq 6.0$ and $-5Cam+25 \leq Xm \leq -8Cam+46$, (b)

$10 < Xm \leq 25$, $0.5 \leq Cam \leq 6.0$ and $-5Cam+15 \leq Xm < -5Cam+25$, (c)

wherein Xm indicating the thickness (MIC) of the metal thin film and Cam indicating wt % of the bismuth in the metal thin film.

In the electronic device thus constructed according to the present invention, the occurrences of whiskers growth and cracks formation on the external terminals thereof can be sufficiently suppressed under the simple structure of the metal thin film formed in direct contact with the surface of the base member, and the Bi content added to Sn can be controlled strictly.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognized that many alternative embodiments can be accomplished using the teachings of the present invention and that the invention is not limited to the embodiments illustrated for explanatory purpose. In the following description, a resin sealed IC will be used as an example of the electronic device.

(First Embodiment)

Figure 1:
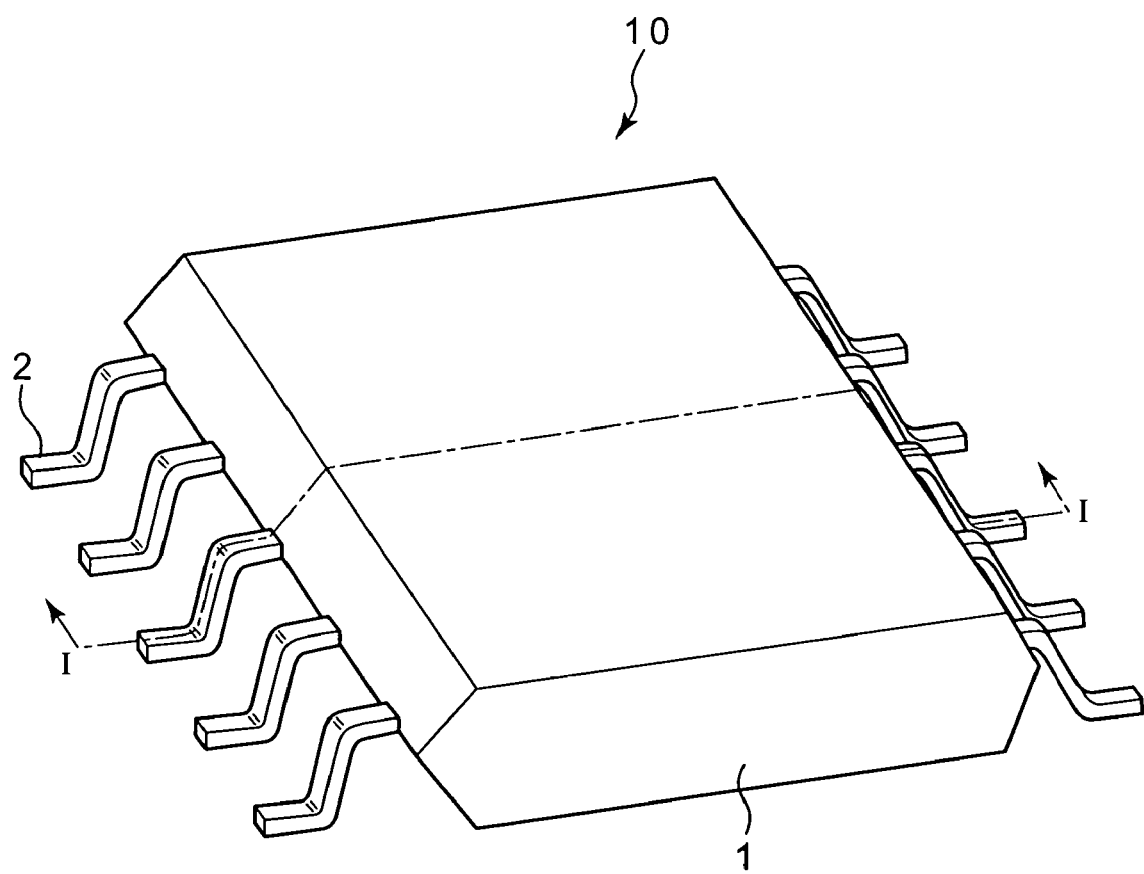
FIG. 1 is an oblique perspective view of an electronic device which is a first embodiment of the present invention.
Figure 2A:
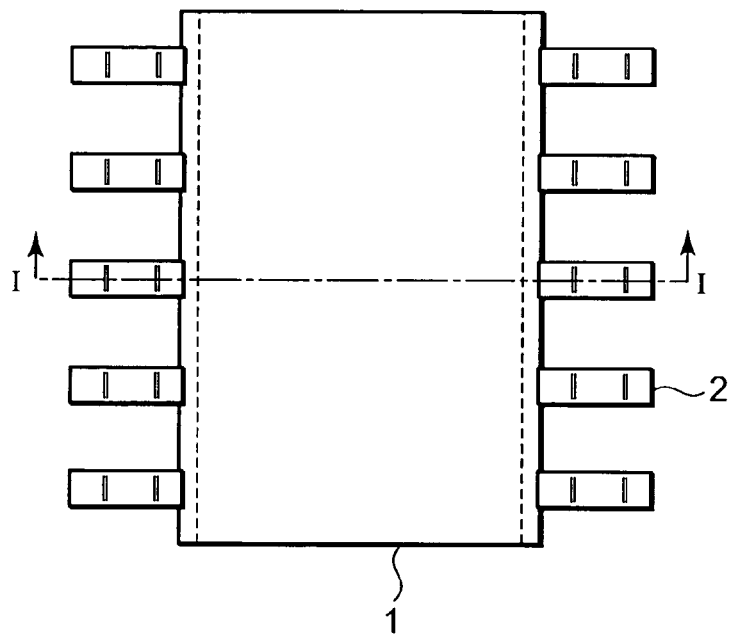
FIG. 2A is a plan view of the electronic device of FIG. 1.
Figure 2B:
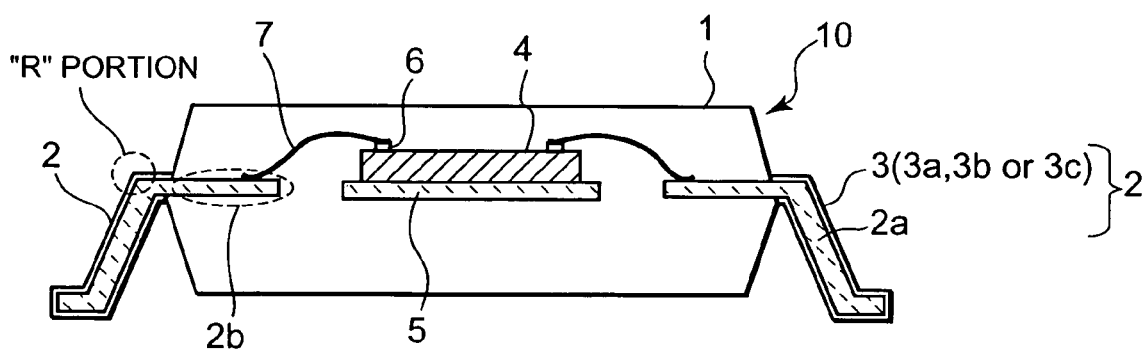
FIG. 2B is a cross sectional view along the line I—I of FIGS. 1 and 2A.
Figure 3:
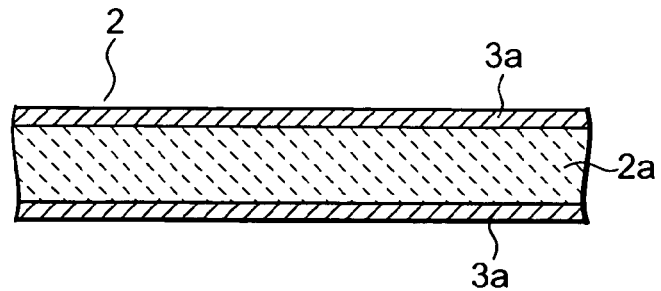
FIG. 3 is a schematic diagram showing a cross sectional structure of a portion of an external terminal of the electronic device of FIG. 1.

Referring now to FIG. 1, FIG. 2A and FIG. 2B, a resin seated IC 10 has such a constitution that a plurality of external terminals 2 is derived from both sides of a package body 1 which is encapsulated with a resin. A base member 2a of the external terminal 2 is composed of a conductive material, e.g., an iron-nickel alloy (hereinafter referred to as "Fe—Ni alloy"). A metal thin film 3 made of a Sn—Bi alloy is formed in direct contact with the surface of the base member 2a by a surface treatment method such as electroplating.

In the package body 1, an IC chip 4 is bonded on a die pad 5 with an adhesive or the like which is not shown. Pad electrodes 6 which are formed on the surface of the IC chip 4 are electrically connected to corresponding internal lead portions 2b by, for example, bonding wires 7. The base member 2a of the external terminal 2 extends to a corresponding internal lead portion 2b. These are integrally formed.

In the present embodiment, the metal thin film 3 is made of the Sn—Bi alloy layer 3a. The content of the Bi in the Sn—Bi alloy layer 3a (hereinafter referred to as "the Bi content") is within a range of 0.5 to 6.0 wt %. The thickness of the Sn—Bi alloy layer 3a (hereinafter referred to as "the film thickness") is controlled to fall within a range of over 10 to 25 MIC. Since the Sn—Bi alloy layer 3a is formed in direct contact with the surface of the base member 2a by electroplating, costs of a plating process cannot be driven up. Further, the film thickness is so controlled as to be within a right range in accordance with the Bi content.

Figure 4:
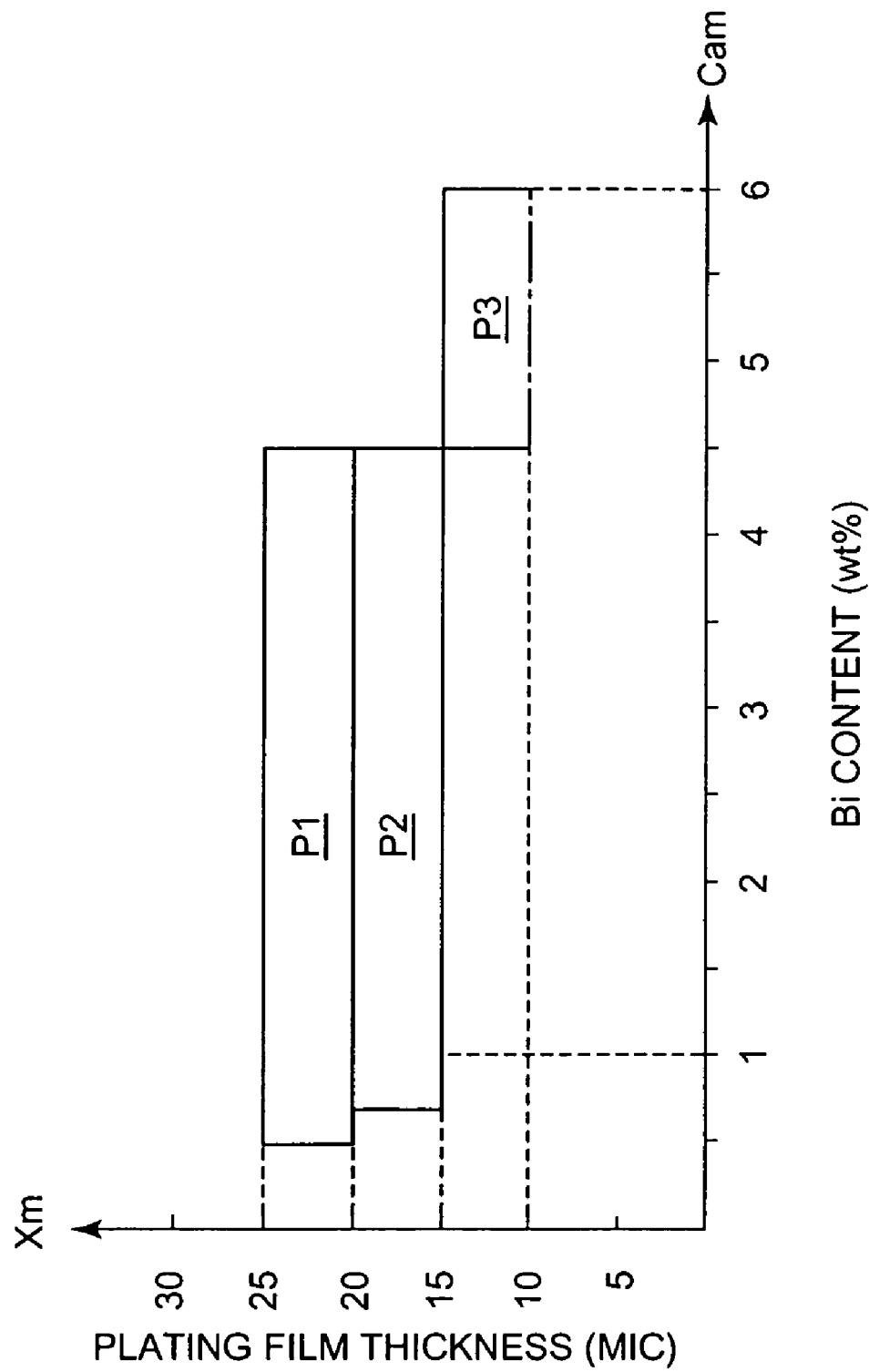
FIG. 4 is a diagram showing an example of ranges of preferred combinations of the Bi content and plating film thickness of a Sn—Bi alloy layer formed on the external terminal of the electronic device of FIG. 1.

FIG. 4 is a diagram showing an example of regions of preferred combinations of the Bi content and the film thickness when the Sn—Bi alloy layer 3a is formed in direct contact with the surface of the base member 2a. In FIG. 4, the diagram is shown on an orthogonal coordinate system, wherein X axis stands for Cam indicating wt % of Bi in the Sn—Bi alloy layer 3a, Y axis stands for Xm indicating the thickness (MIC) of the Sn—Bi alloy layer 3a and preferred combinations of Cam and Xm are expressed as corresponding coordinate regions.

Referring to FIG. 4, the content of Bi is within a range of 0.5 to 6.0 wt %, and the film thickness is controlled so as to fall within a right range in accordance with the Bi content. For example, when the wettability of a low-melting Pb-free solder is important, the Bi content is required about 4 wt % and above, and by adjusting the film thickness to be within the range of over 10 to 15 MIC, the superior physical properties can be attained on the whole. On the other hand, when it is required to keep the Bi content less than 1 wt %, the film thickness is controlled to be within a range of 20 to 25 MIC. Hereinafter, first embodiment will be described in detail.

A region P1 shown in FIG. 4 indicates that the film thickness is preferably controlled to be within the range of 20 to 25 MIC when the Bi content is within a range of 0.5 to 4.5 wt %. A region P2 indicates that the film thickness is preferably controlled to be within the range of 15 to 20 MIC when the Bi content is within a range of 0.7 to 4.5 wt %. A region P3 indicates that the film thickness is preferably controlled to be within the range of over 10 to 15 MIC when the Bi content is within a range of 4.5 to 6.0 wt %. By controlling the film thickness so as to fall within the right ranges in accordance with the Bi content as described above, the occurrences of whiskers growth and cracks formation in the Sn—Bi alloy layer 3a can be sufficiently suppressed without impairing the wettability of the low-melting solder. Further, since the accuracy of estimation of the Bi content can be also improved, exact management of the Bi content becomes possible, and reliability of bonding between the external terminal and a mounting board can be secured.

Figure 5:
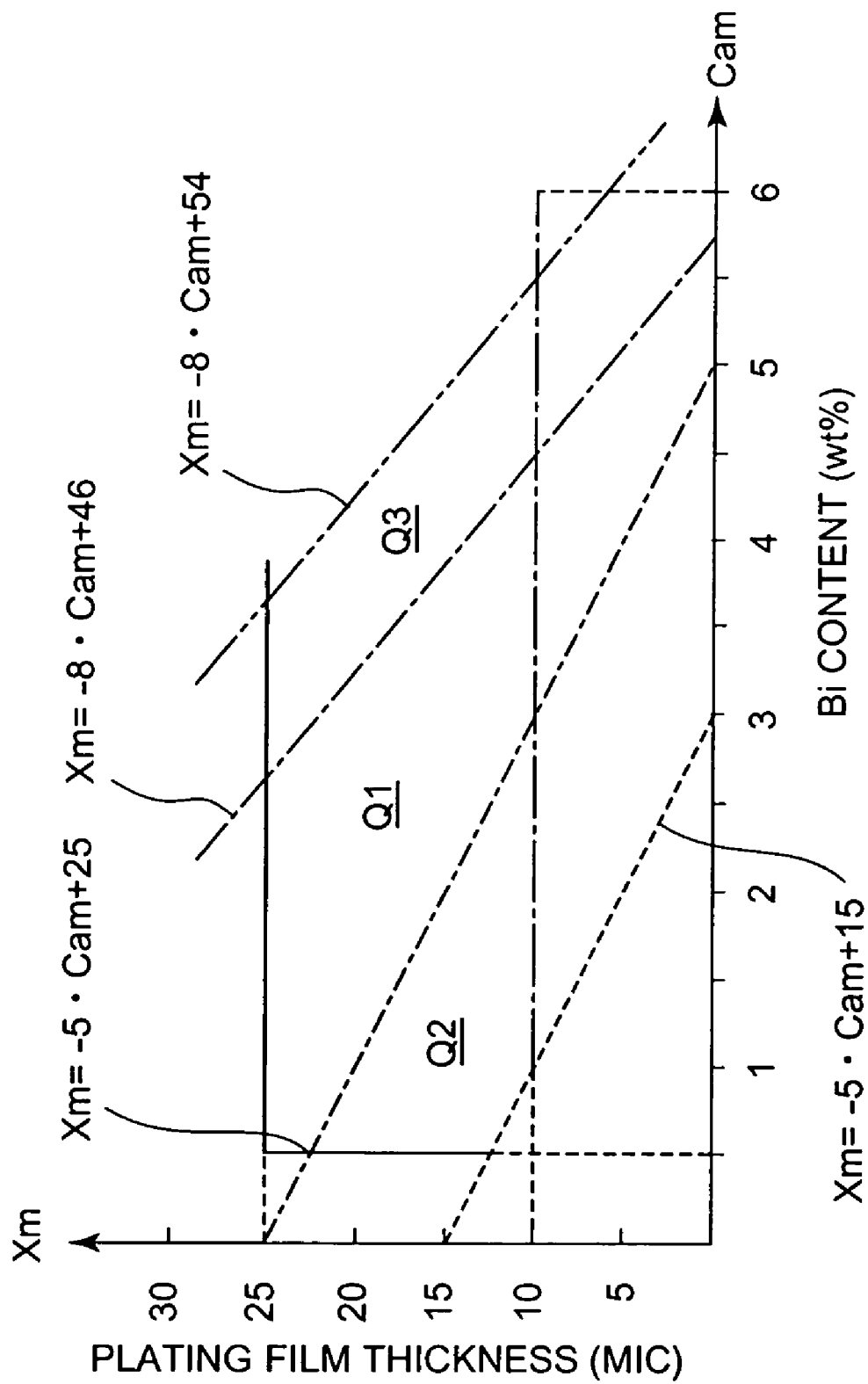
FIG. 5 is a diagram showing another example of ranges of preferred combinations of the Bi content and plating film thickness of the Sn—Bi alloy layer formed on the external terminal of the electronic device of FIG. 1.

Then, referring to FIG. 5, a region Q1 shown in FIG. 5 is a region wherein a combination of Cam indicating wt % of the Bi of the Sn—Bi alloy layer 3a and Xm indicating the thickness (MIC) of the Sn—Bi alloy layer 3a satisfies all the following expressions:

$$10 < Xm \leq 25,\ 0.5 \leq Cam \leq 6\ \text{and}\ -5Cam+25 \leq Xm \leq -8Cam+46.$$

When a combination of Cam and Xm is within the region Q1, the Sn—Bi alloy layer 3a is free from the occurrence of cracks formation in bending the external terminal 2 and the occurrence of whiskers growth.

A region Q2 shown in FIG. 5 is a region wherein a combination of Cam and Xm satisfies all the following expressions:

$$10 < Xm \leq 25,\ 0.5 \leq Cam \leq 6\ \text{and}\ -5Cam+15 \leq Xm < -5Cam+25.$$

When a combination of Cam and Xm is within the region Q2, the Sn—Bi alloy layer 3a has no cracks formation occurring in bending the external terminal 2, although the occurrence of very short whiskers growth, which cannot make a short-circuit between the adjacent terminals, may still be barely observed in the Sn—Bi alloy layer 3a.

A region Q3 shown in FIG. 5 is a region wherein a combination of Cam and Xm satisfies all the following expressions:

$$10 < Xm \leq 25,\ 0.5 \leq Cam \leq 6\ \text{and}\ -8Cam+46 < Xm \leq -8Cam+54.$$

When a combination of Cam and Xm is within the region Q3, the Sn—Bi alloy layer 3a is free from the occurrence of whiskers growth, although fine cracks, which are not large enough to reach the base member, may be observed in bending the external terminal 2.

Therefore, when neither the cracks formation in bending the external terminal 2 nor the whiskers growth is acceptable, a combination of Cam and Xm must be adjusted so as to fall within the region Q1.

Further, when the occurrence of fine cracks which are not large enough to reach the base member is permitted, although the whiskers growth is not acceptable, a combination of Cam and Xm should be adjusted to fall within the region Q1 or Q2. More specifically, a combination of Cam and Xm should be adjusted so as to satisfy all the following expressions:

$$10 < Xm \leq 25,\ 0.5 \leq Cam \leq 6,\ -5Cam+15 \leq Xm < -8Cam+46.$$

Meanwhile, when a few, very short whiskers growth, which will never make a short-circuit between the adjacent external terminals, is acceptable although the cracks formation in bending the external terminal 2 is not acceptable, a combination of Cam and Xm should be adjusted to fall within the region Q1 or Q3. More specifically, a combination of Cam and Xm should be adjusted so as to satisfy all the following expressions:

$$10 < Xm \leq 25,\ 0.5 \leq Cam \leq 6\ \text{and}\ -5Cam+25 < Xm \leq -8Cam+54.$$

In addition, when a few, very short whiskers growth and the fine cracks, which are not large enough to reach the base member, occurred in bending the external terminal 2 are acceptable, a combination of Cam and Xm should be adjusted to fall within any one of the regions Q1, Q2 and Q3.

More specifically, a combination of Cam and Xm should be adjusted so as to satisfy all the following expressions:

$$10 < Xm \leq 25, \ 0.5 \leq Cam \leq 6 \text{ and } -5Cam+15 \leq Xm \leq -8Cam+54.$$

In this case, a permissible range of a combination of Cam and Xm is significantly expanded, thereby improving productivity.

Next, evaluation results from which the regions of FIGS. 4 and 5 have been derived will be described.

(1) About Wettability of Solder

In the Sn—Bi alloy layer 3a, the wettability of a solder improves as the Bi content increases. However, even if the Bi content becomes zero, in other words, Sn constitutes 100%, the wettability of the solder is still acceptable from a practical standpoint. Meanwhile, it has been confirmed that when the film thickness is about 3 MIC and below, it becomes difficult to keep up sufficient wettability due to the occurrence of pinholes and the like therein, so that the film thickness is desirably adjusted to about 5 MIC and above, more preferably over 10 MIC. Thus, no deterioration in the wettability of the solder occurs by adjusting the Bi content to falling within the range of 0.5 to 6.0 wt % and the film thickness to falling within the range of over 10 to 25 MIC, as shown in FIG. 4 or 5.

(2) About Whiskers

The whiskers growth was evaluated as follows: preparing a plurality of samples having different combinations of the Bi content and the film thickness, wherein the Sn—Bi alloy layer 3a of each of a plurality of samples is formed by plating, keeping the samples in an atmosphere where whiskers growth often occurs for a predetermined time, then observing the whiskers.

Figure 6:
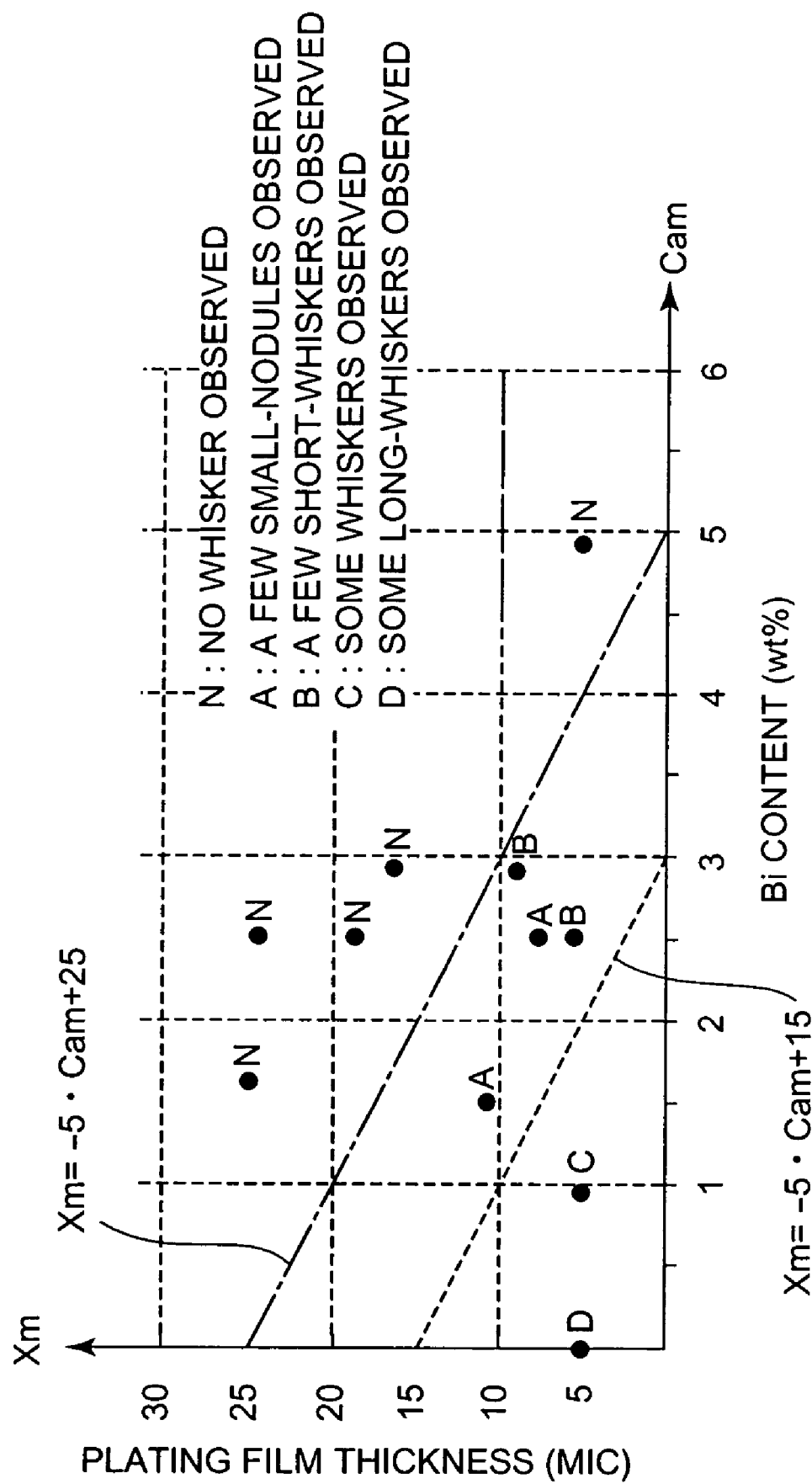
FIG. 6 is a diagram showing the results of evaluation of whiskers in the relationship between the Bi content and plating film thickness of the Sn—Bi alloy layer formed on the external terminal of the electronic device of FIG. 1.

FIG. 6 shows an orthogonal coordinate system similar to that of FIG. 4 or 5 which shows the observation results for the whiskers growth. A symbol N denotes a coordinate point corresponding to a combination of Cam and Xm of the sample in which no whiskers growth was observed. A symbol A denotes a coordinate point corresponding to a combination of Cam and Xm a sample in which fine nodules were observed. A symbol B denotes a coordinate point corresponding to a combination of Cam and Xm of a sample in which very short whiskers growth which cannot make short-circuit between the adjacent external terminals was barely observed. A symbol C denotes a coordinate point corresponding to a combination of Cam and Xm of a sample in which a number of whiskers growth were observed. A symbol D denotes a coordinate point corresponding to a combination of Cam and Xm of a sample in which whiskers having the potential of making short-circuit between the adjacent external terminals are observed.

The following can be taught by referring to FIG. 6.

(1) With a Bi content of lower than about 3 wt %, the whiskers growth is hardly observed by adjusting the film thickness to about 10 MIC and above.

(2) With a Bi content of about 5 wt % and above, the whiskers growth can be inhibited even if the plating film is thin.

(3) When a combination of Cam and Xm is in a region above a first line represented by a formula Xm=−5Cam+15, i.e., a region which satisfies −5Cam+15≦Xm, only very short whiskers growth, which cannot make short-circuit between the adjacent external terminals, is barely observed, and multiple whiskers growth are not observed.

(4) When a combination of Cam and Xm is in a region above a second line represented by a formula Xm=−5Cam+25, i.e., a region which satisfies −5Cam+25≦Xm, no whiskers growth is observed.

Thus, the following is understood with respect to the whiskers growth. That is, when the Sn—Bi alloy layer 3a is used as the metal thin film 3, the whiskers growth can be suppressed sufficiently, even with a plating structure in direct contact with the surface of the base member 2a, by adjusting a combination of Cam and Xm to fall within any one of the regions P1, P2 and P3 shown in FIG. 4 or any one of the regions Q1, Q2 and Q3 shown in FIG. 5.

(3) About Cracks

Figure 7:
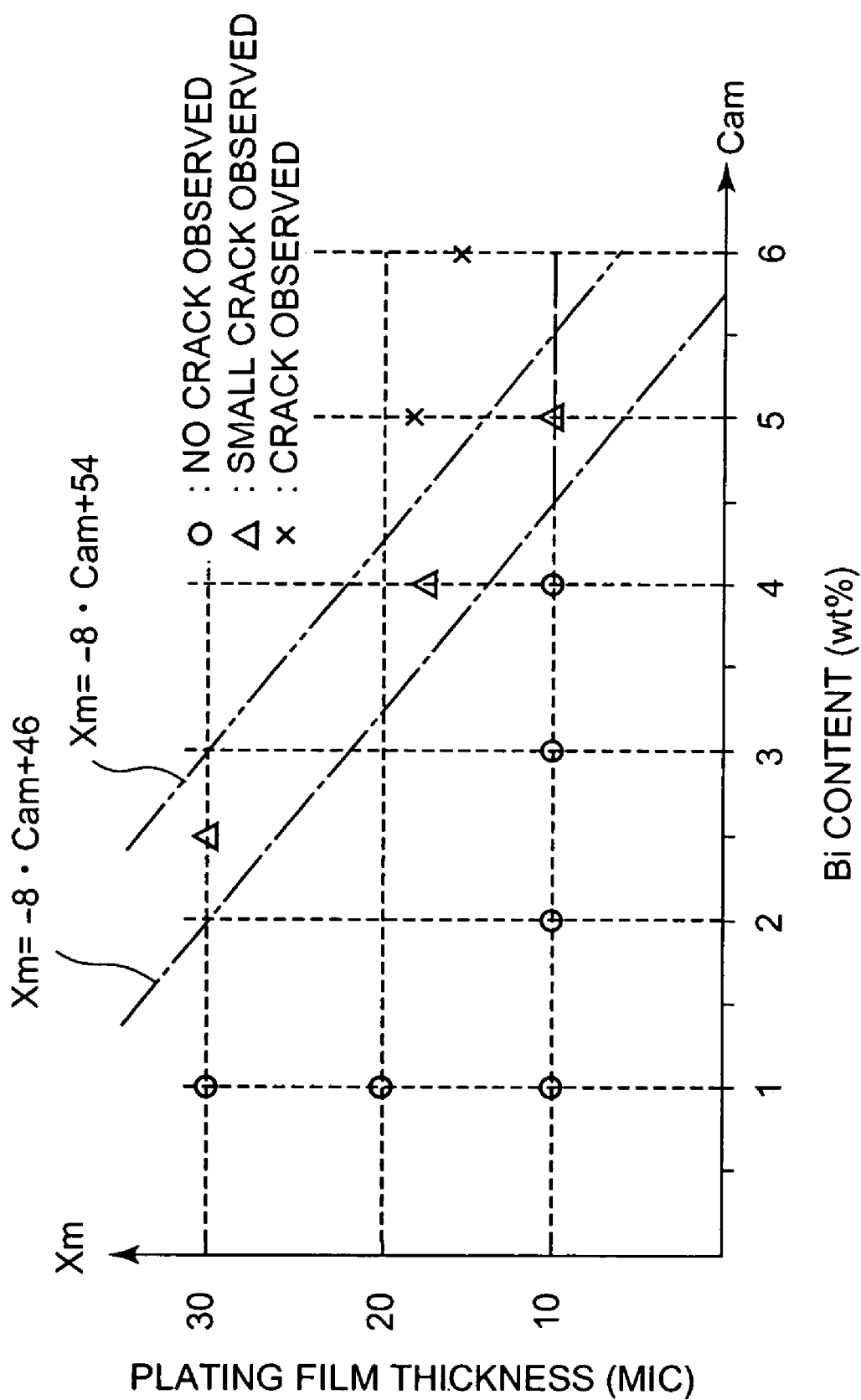
FIG. 7 is a diagram showing the occurrence of cracks in the relationship between the Bi content and plating film thickness of the Sn—Bi alloy layer formed on the external terminal of the electronic device of FIG. 1.

The cracks formation was evaluated by using, as a sample to be evaluated, a resin-sealed semiconductor device (not shown) comprising a TQFP (Thin Quad Flat Package) having 80 pins. An external terminal of the not-shown semiconductor device is formed by electroplating a Sn—Bi alloy as a metal thin film 3 on the surface of a base member comprising a Fe—Ni alloy. A cross section of the external terminal has the same structure as that of FIG. 2. Further, a plurality of samples having different combinations of the Bi content, Cam in wt %, and plating film thickness, Xm in MIC, of the Sn—Bi alloy layer 3a were prepared so as to evaluate the cracks formation in the Sn—Bi alloy layers 3a at lead bended "R" portions (shown in FIG. 2) of the external terminals of the samples after the external terminals have gone through lead bending procedure. FIG. 7 is a diagram showing an orthogonal coordinate system similar to FIG. 4 or 5 which shows the cracks formation in the Sn—Bi alloy layers 3a in bending the external terminal 2. In FIG. 7, a symbol ○ (white circle) denotes a coordinate point corresponding to a combination of Cam and Xm of a sample in which no cracks formation was observed. A symbol △ (trigon) denotes a coordinate point corresponding to a combination of Cam and Xm of a sample in which the fine cracks formation being not large enough to reach the base member was observed. A symbol × (multiple mark) denotes a coordinate point corresponding to a combination of Cam and Xm of a sample in which the cracks formation coming down to the base member was observed.

The following can be taught by referring to FIG. 7.

(1) Taken as a whole, the cracks formation is reduced as the film thickness and the Bi content decrease.

(2) With the film thickness of about 10 MIC and below, only fine cracks formation can be observed even if the Bi content is about 5 wt %.

(3) With the film thickness of about 20 MIC, the cracks formation can be observed even if the Bi content is about 4 wt %.

(4) When a combination of Cam and Xm is in a region below a third line represented by a formula Xm=−8Cam+54, i.e., a region which satisfies Xm≦−8Cam+54, only the fine cracks formation which is not large enough to reach the base member is observed, and no cracks formation coming down to the base member was observed.

(5) When a combination of Cam and Xm is in a region below a fourth line represented by a formula Xm=−8Cam+46, i.e., a region which satisfies Xm≦−8Cam+46, no cracks formation including micro cracks is observed at all.

Thus, the following is understood with respect to the cracks formation. That is, it is preferred to keep the Bi content at about 3 wt % or lower and the film thickness at about 10 MIC or smaller, and it is undesirable to have a Bi content of about 4 wt % or higher and a film thickness of about 20 MIC or larger.

Consequently, when the Sn—Bi alloy layer 3a is used as the metal thin film 3, the cracks formation can be suppressed sufficiently by adjusting a coordinate point corresponding to a combination of Cam and Xm to fall within any one of the regions P1, P2 and P3 shown in FIG. 4 or any one of the regions Q1, Q2 and Q3 shown in FIG. 5.

(4) About Accuracy of Measurement of Bi Content

Figure 8:
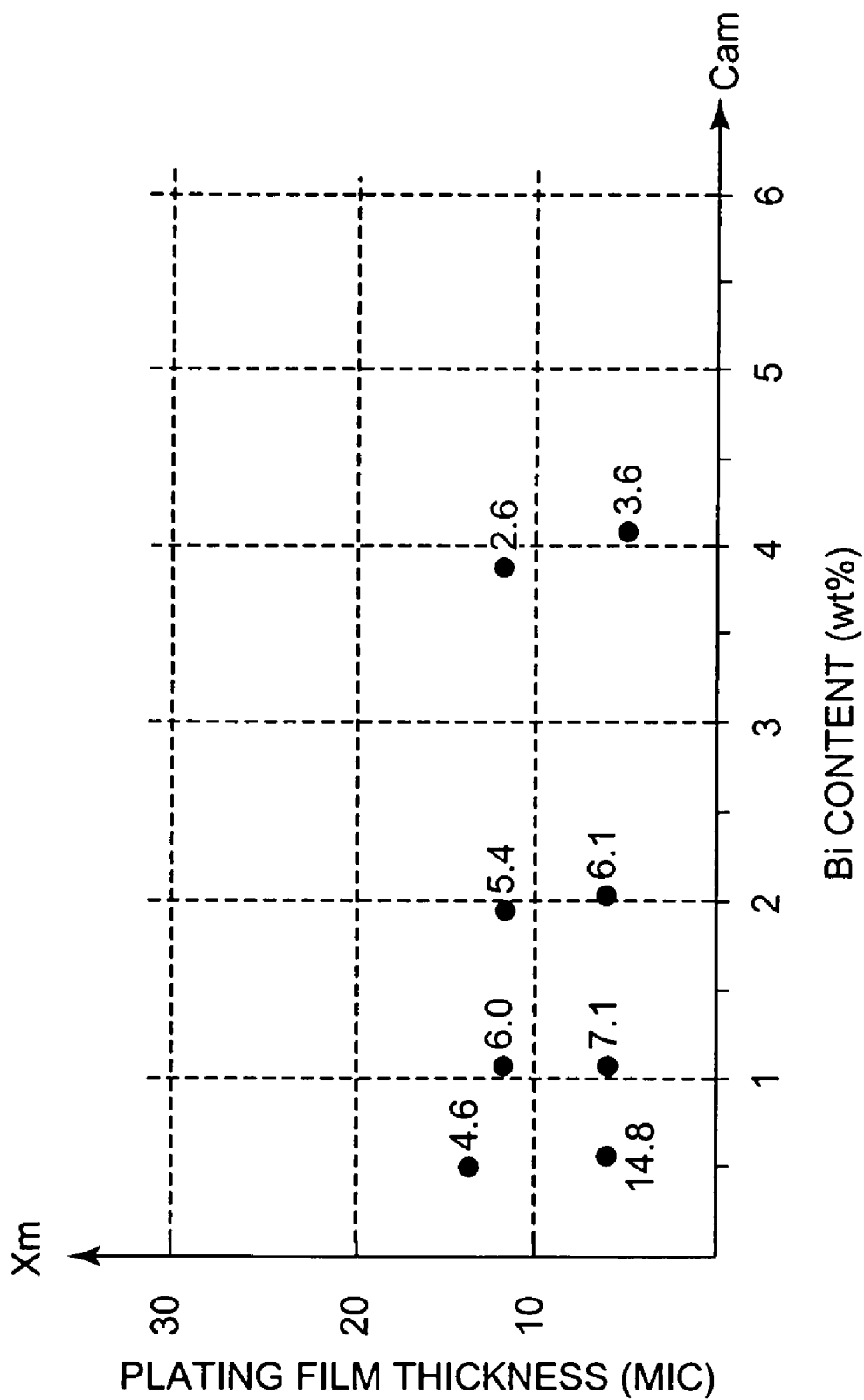
FIG. 8 is a diagram showing the evaluation results of variations in measurement of plating composition in the relationship between the Bi content and plating film thickness of the Sn—Bi alloy layer formed on the external terminal of the electronic device of FIG. 1.

FIG. 8 is a diagram illustrating, on an orthogonal coordinate system similar to that shown in FIG. 4 or 5, an example of evaluating variations in the results of measurements of the Bi contents. The Bi content was measured by use of a fluorescent X-ray analysis using a proportional counter as a detector. In FIG. 8, numeral allocated to each of the coordinate points represents coefficient of, variation of the observed values for the content of Bi in Sn—Bi alloy layer 3a which has Cam and Xm corresponding to each of the coordinate points. (Coefficient of variation is obtained by dividing standard deviation of the results of fixed-point repetitive measurements by their average value.) The smaller the value is, the smaller the variation in the measured values of the Bi content.

The following can be taught by referring to FIG. 8.

(1) In a region where the film thickness is over about 10 MIC, the Bi content can be measured with practical accuracy.

(2) In a region where the film thickness is as thin as about 5 MIC and the Bi content is less than about 1 wt %, variations become extremely large, and measurement accuracy deteriorates.

Thus, to take strict control of composition within a region where the Bi content is less than about 1 wt %, the film thickness must be about 10 MIC and above.

Consequently, when the Sn—Bi alloy layer 3a is used as the metal thin film 3, variations in measurement of the Bi content can be controlled and measurement accuracy can be improved by adjusting a coordinate point corresponding to a combination of the Bi content and the film thickness to fall within any one of the regions P1, P2 and P3 shown in FIG. 4 or the regions Q1, Q2 and Q3 shown in FIG. 5.

(5) About Bonding Reliability

When an electronic device having an Sn—Bi alloy layer 3a plated on the surfaces of external terminals is implemented on a circuit board or the like by an Sn—Bi alloy solder, the total Bi content in the implemented/bonded system (plating+soldering) determines bonding reliability for the assembled circuit board. Thus, to secure bonding reliability, the Bi content in the Sn—Bi alloy layer 3a must be so controlled as to fall within a range corresponding to the implemented/bonded system. With the film thickness of about 10 MIC and above, sufficient measurement accuracy can be maintained and bonding reliability can be secured even if the Bi content is less than 1%.

The foregoing regions shown in FIG. 4 were established based on the results of evaluations and considerations of the wettability, occurrence of whiskers growth, occurrence of cracks formation, variation in measurement of the Bi content and bonding reliability. Further, the regions shown in FIG. 5 were also set based on the results of evaluations and considerations of the wettability, occurrence of whiskers growth, occurrence of cracks formation, variation in measurement of the Bi content and bonding reliability, particularly in consideration of the first and second lines of FIG. 6 and the third and fourth lines of FIG. 7.

Thus, according to the resin sealed IC 10 of the first embodiment, the Sn—Bi alloy layer 3a, which is formed in direct contact with the surface of the base member 2a of the external terminal 2 through plating, is formed as the metal thin film 3. Further, the Bi content is within a range of 0.5 to 6.0 wt %. In addition, the film thickness is controlled within a range of over 10 to 25 MIC in accordance with the Bi content so that a combination of the Bi content and the film thickness would fall within any one of the regions shown in FIG. 4 or 5. Hence, the occurrences of whiskers growth and cracks formation can be suppressed as an application of the electronic device without impairing the wettability of the low-melting solder. Further, the accuracy of measurement of the Bi content can also be improved, so strict control of the Bi content becomes possible, and the bonding reliability of the external terminals can be secured.

(Second Embodiment)

Figure 9:
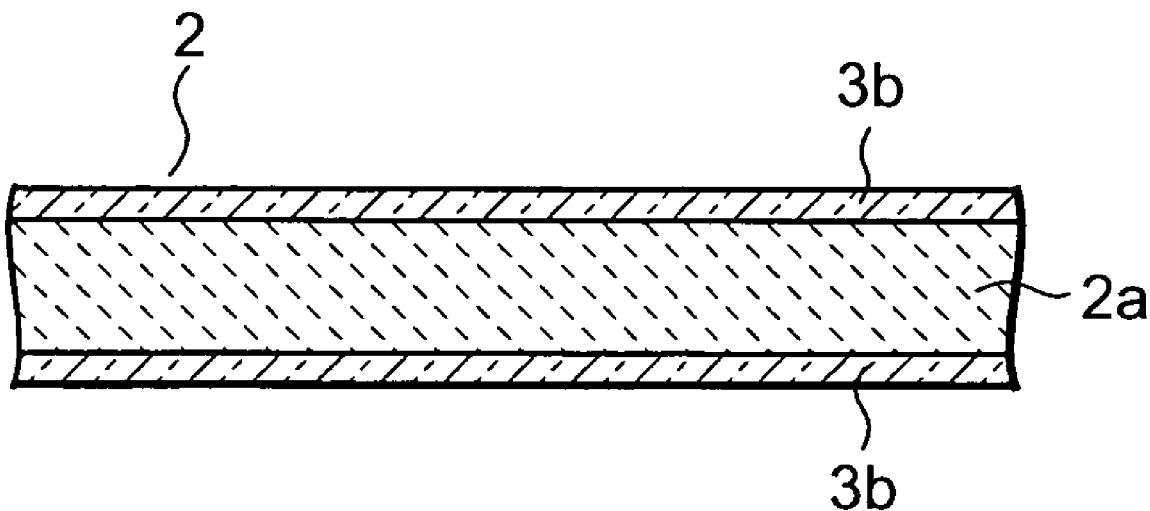
FIG. 9 is a schematic diagram showing a cross sectional structure of a portion of an external terminal of an electronic device which is a second embodiment of the present invention.

FIG. 9 is a schematic diagram showing a cross sectional structure of a portion of an electronic device which is a second embodiment of the present invention. The constitution of the electronic device of the second embodiment is significantly different from the constitution of the above first embodiment in that the electronic device of the second embodiment uses a Sn-silver (hereinafter referred to as Sn—Ag) alloy layer 3b in place of Sn—Bi alloy layer 3a as a metal thin film 3. The electronic device of the second embodiment is constituted almost in the same manner as the first embodiment of FIGS. 1 and 2. That is, a plurality of external terminals 2 which comprise, e.g., an Fe—Ni alloy are drawn out from both sides of a package body 1 which is encapsulated with a resin, and inside the package body 1, an IC chip 4 is bonded on a die pad 5 by an adhesive or the like which is not shown. Further, pad electrodes 6 which are formed on the surface of the IC chip 4 are electrically connected to corresponding internal lead portions 2b by, for example, bonding wires 7. The base member 2a of the external terminal 2 extends to a corresponding internal lead portion 2b. These are monolithically formed. Further, as a metal thin film 3, the Sn—Ag alloy layer 3b is formed in direct contact with the surface of the base member 2a by a surface treatment method such as electroplating.

In the second embodiment, as shown in FIG. 9, the metal thin film 3 is made of a Sn—Ag alloy resulting from addition of Ag to Sn and has a simple structure. Further, the content of Ag in the Sn—Ag alloy layer 3b is 2.0 to 4.0 wt % and the film thickness of the Sn—Ag alloy layer 3b is 15 to 25 MIC. Although specific data will be omitted, regions corresponding to preferred combinations of the Ag content and the film thickness of the Sn—Ag alloy layer 3b as the metal thin film 3 in the second embodiment were set by making the same studies as those in the case of the Sn—Bi alloy layer 3a in the first embodiment.

The second embodiment can further improve the resistance to the crack formation, as compared with the Sn—Bi alloy layer 3a of the first embodiment, by adjusting the film thickness of the Sn—Ag alloy layer 3b so as to fall within a right range in accordance with the Ag content in the Sn—Ag alloy layer 3b. However, wettability and the resistance to the whisker growth are slightly degraded as compared with the Sn—Bi alloy layer 3a of the first embodiment. Further, by choosing a preferred combination of higher Ag content and more thick plating film, external terminal's bonding reliability and the accuracy of measurement of the Ag content can be improved almost in the same manner as in the first embodiment.

Thus, same effects as those described in the first embodiment can be obtained with the constitution of the second embodiment.

(Third Embodiment)

The constitution of the electronic device of the third embodiment is significantly different from the constitution of the above first embodiment in that the electronic device of the third embodiment uses a Sn-zinc (hereinafter referred to as Sn—Zn) alloy layer 3c in place of Sn—Bi alloy layer 3a as a metal thin film 3. The electronic device of the third embodiment is constituted almost in the same manner as the first embodiment of FIGS. 1 and 2. In the third embodiment, the metal thin film 3 is made of a Sn—Zn alloy resulting from addition of Zn to Sn and has a simple structure.

Figure 10:
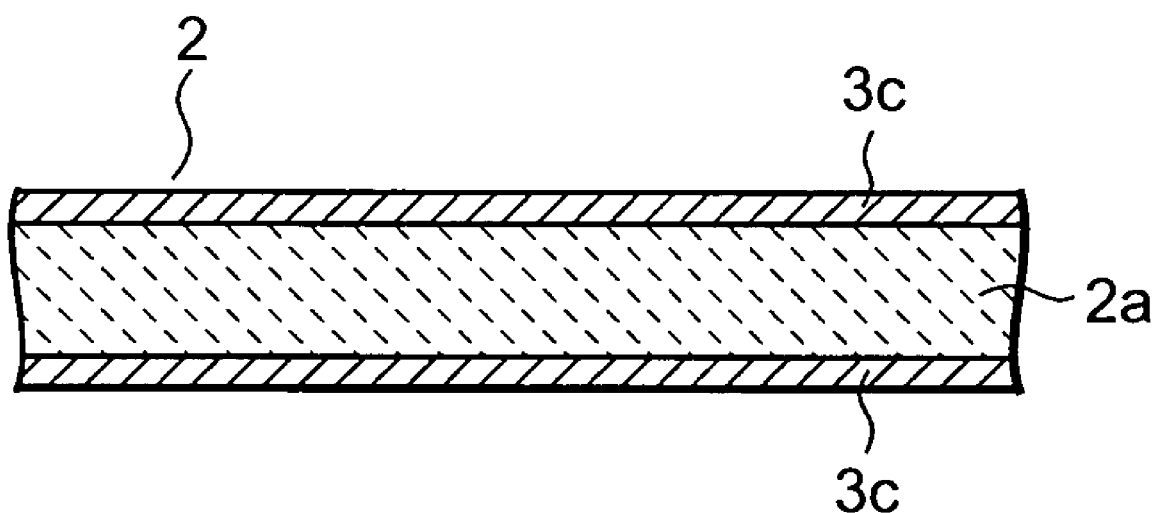
FIG. 10 is a schematic diagram showing a cross sectional structure of a portion of an external terminal of an electronic device which is a third embodiment of the present invention.

Referring now to FIG. 10, a Sn—Zn alloy layer 3c is formed in direct contact with the surface of the base member 2a by a surface treatment such as electroplating. Further, the content of Zn in the Sn—Zn alloy layer 3c is 4.0 to 9.0 wt % and the film thickness of the Sn—Zn alloy layer 3c is adjusted to fall within a range of 15 to 30 MIC.

In the third embodiment, by adjusting the film thickness of the Sn—Zn alloy layer 3c so as to fall within a right range in accordance with the Zn content in the Sn—Zn alloy layer 3c, the occurrences of whiskers growth and cracks formation can be sufficiently suppressed without impairing wettability, as in the case of the first embodiment. Further, external terminal's bonding reliability and the accuracy of measurement of the Zn content can also be improved.

Thus, same effects as those described in the first embodiment can be obtained with the constitution of the third embodiment.

Figure 11A:
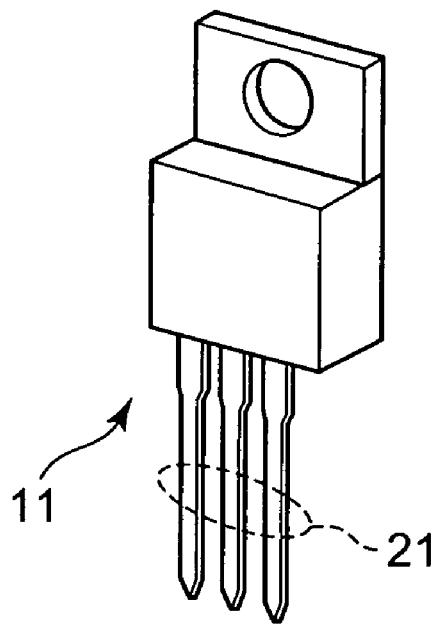
FIG. 11A is an oblique perspective view of an example of an electronic device (lead-insertion-type transistor) to which the present invention is applied.
Figure 11B:
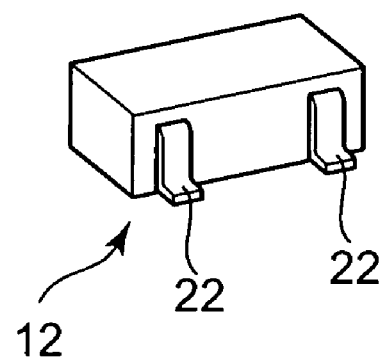
FIG. 11B is an oblique perspective view of an example of an electronic device (surface-mounting-type transistor) to which the present invention is applied.
Figure 11C:
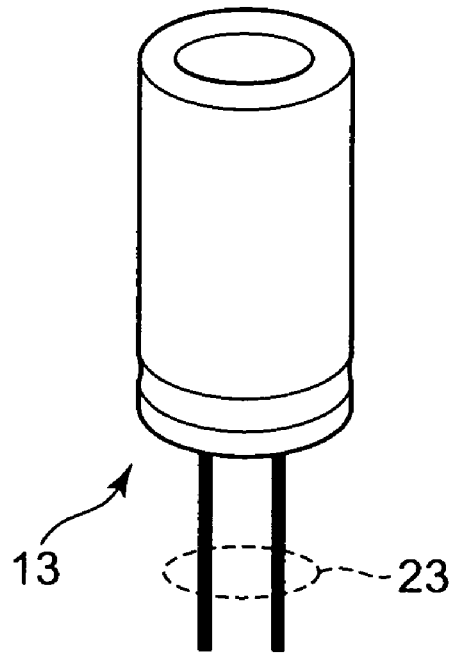
FIG. 11C is an oblique perspective view of an example of an electronic device (electrolytic capacitor) to which the present invention is applied.
Figure 12:
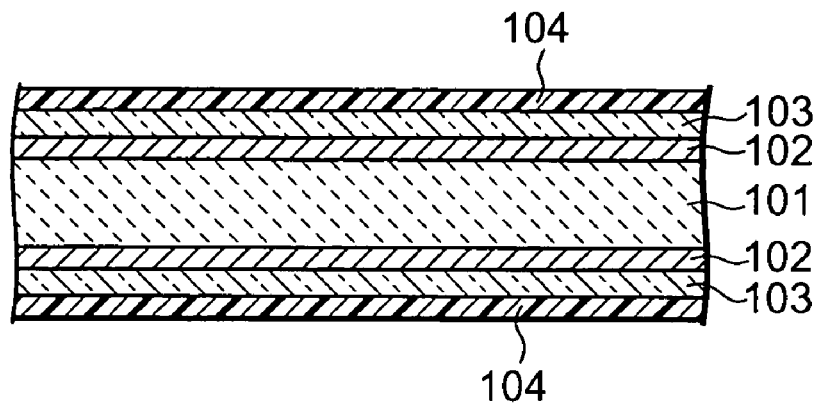
FIG. 12 is a schematic diagram showing a cross sectional structure of a portion of lead of a conventional semiconductor device.
Figure 13:
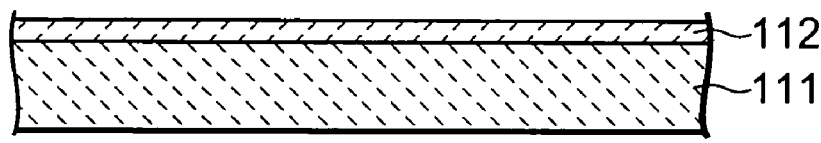
FIG. 13 is a schematic diagram showing a cross sectional structure of a portion of a conventional lead material for electronic devices.
Figure 14:
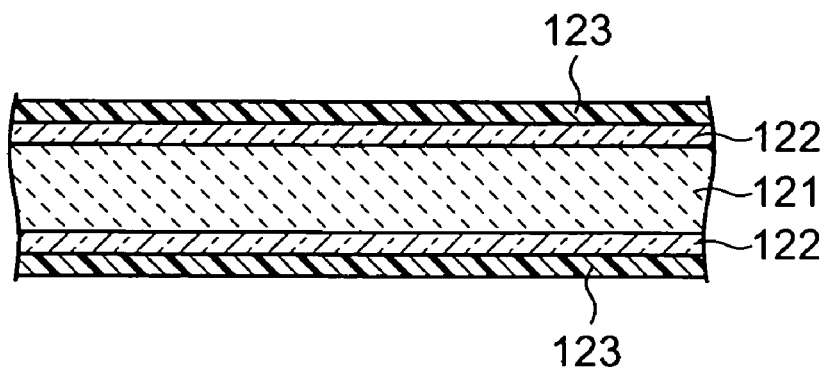
FIG. 14 is a schematic diagram showing a cross sectional structure of a portion of lead of a conventional semiconductor device.

It is apparent that the present invention is not limited to the above embodiments, but may be modified and changed without departing from the spirit and scope of the invention. For example, in the foregoing embodiments, the lead-shaped external terminal having the metal thin film formed thereon has been described. However, the type of the external terminal is not limited to the lead type, external terminals having any type such as a bump or film can be used as long as they can function as external terminals. Further, in the foregoing embodiments, an IC has been used as an electronic device, and the case where the present invention has been applied to the external terminals of the IC has been described. However, in addition to the IC, the present invention is applicable to the external terminals of other electronic devices such as the external terminals 21 of a lead-insertion-type transistor 11 as shown in FIG. 11A, the external terminals 22 of a surface-mounting-type transistor 12 as shown in FIG. 11B, and the external terminals 23 of an electrolytic capacitor 13 as shown in FIG. 11C.

Further, as a surface treatment method for forming the metal thin film made of the Sn-based alloy, such as the Sn—Bi alloy, the Sn—Ag alloy and the Sn—Zn alloy, on the surface of the base member of the external terminal of the electronic device, electroplating has been described as an example thereof. However, other plating methods such as electroless plating or a combination of electrolytic plating and the electroless plating can also be applied. Further, the Fe—Ni alloy has been used as an example of the base member on which the metal thin film of the Sn-based alloy is formed according to the present invention. But, the base member is not limited to the Fe—Ni alloy, and a Fe—Ni-based alloy which further contains other metal components may also be used. In addition, the base member is not limited to the Fe—Ni-based alloy, and materials such as Cu, a Cu-based alloy which contains Cu as a main component and Fe may also be used.

What is claimed is:

1. An electronic device comprising:
a plurality of external terminals each having a base member and a metal thin film formed in direct contact with a surface of the base member,
the metal thin film being made of an alloy of tin and bismuth and the bismuth being contained in the alloy so as to satisfy any one of the following conditional expressions;
(a) $20 \leq Xm \leq 25$ and $0.5 \leq Cam \leq 4.5$,
(b) $15 \leq Xm \leq 20$ and $0.7 \leq Cam \leq 4.5$,
wherein Xm indicating the thickness (MIC) of the metal thin film and Cam indicating wt % of the bismuth in the metal thin film.

2. The electronic device as claimed in claim 1, wherein the metal thin film is formed by plating.

3. The electronic device as claimed in claim 1, wherein the base member is composed of a conductive material.

4. The electronic device as claimed in claim 3, wherein the conductive material comprises a metal selected among the group consisting of an iron-nickel alloy, an iron-nickel-based alloy, copper, a copper-based alloy and iron.

5. The device of claim 1 wherein,
the metal thin film satisfies the following conditional expression:
(a) $20 \leq Xm \leq 25$ and $0.5 \leq Cam \leq 4.5$.

6. The device of claim 1 wherein,
the metal thin film satisfies the following conditional expression:
(b) $15 \leq Xm \leq 20$ and $0.7 \leq Cam \leq 4.5$.

7. An electronic device comprising:
a plurality of external terminals each having a base member and a metal thin film formed in direct contact with a surface of the base member,
the metal thin film being made of an alloy of tin and bismuth and the bismuth being contained in the alloy so as to satisfy the following conditional expression;
$15 \leq Xm \leq 25$, $0.5 \leq Cam \leq 3.0$, and $-5Cam+25 \leq Xm \leq -8Cam+46$,
wherein Xm indicating the thickness (MIC) of the metal thin film and Cam indicating wt % of the bismuth in the metal thin film.

8. The electronic device as claimed in claim 7, wherein the metal thin film is formed by plating.

9. The electronic device as claimed in claim 7, wherein the base member is composed of a conductive material.

10. The electronic device as claimed in claim 9, wherein the conductive material comprises a metal selected among the group consisiting of an iron-nickel alloy, an iron-nickel-based alloy, copper, a copper-based alloy and iron.

11. An electronic device, comprising:
a plurality of external terminals, each terminal having a base member and a metal thin film formed in direct contact with a surface of the base member,
the metal thin film being made of an alloy of tin and bismuth, the bismuth being contained in the alloy so as to satisfy the following conditional expression;
$15 \leq Xm \leq 25$, $0.5 \leq Cam \leq 3.0$, and $-5Cam+15 \leq Xm < -5Cam+25$,
wherein Xm indicates the thickness (MIC) of the metal thin film and Cam indicates wt % of the bismuth in the metal thin film.

12. The electronic device as claimed in claim 11, wherein the metal thin film is formed by plating.

13. The electronic device as claimed in claim 11, wherein the base member is composed of a conductive material.

14. The electronic device as claimed in claim 13, wherein the conductive material comprises a metal selected among the group consisting of an iron-nickel alloy, an iron-nickel-based alloy, copper, a copper-based alloy and iron.

* * * * *